US008770906B2

(12) United States Patent  
Atsumi et al.

(10) Patent No.: US 8,770,906 B2
(45) Date of Patent: Jul. 8, 2014

(54) SUBSTRATE SUPPORT APPARATUS AND SUBSTRATE TRANSPORT APPARATUS HAVING SHOCK ABSORPTION

(75) Inventors: Masahiro Atsumi, Tokyo (JP); Masaaki Ishida, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 529 days.

(21) Appl. No.: 12/706,901

(22) Filed: Feb. 17, 2010

(65) Prior Publication Data

US 2010/0221089 A1 Sep. 2, 2010

(30) Foreign Application Priority Data

Feb. 27, 2009 (JP) .................................. 2009-045597
Feb. 1, 2010 (JP) .................................. 2010-020734

(51) Int. Cl.
*H01L 21/763* (2006.01)
*H01L 21/677* (2006.01)

(52) U.S. Cl.
USPC ....................................... 414/225.01; 294/213

(58) Field of Classification Search
CPC ............... H01L 21/673; H01L 21/677; H01L 21/67742
USPC .................. 414/225.01, 729; 294/213; 901/30
See application file for complete search history.

(56) References Cited

U.S. PATENT DOCUMENTS

| 4,086,870 A | * | 5/1978 | Canavello et al. | 118/52 |
| 5,457,368 A | * | 10/1995 | Jacobsen et al. | 318/568.16 |
| 5,621,318 A | * | 4/1997 | Jacobsen et al. | 324/207.22 |
| 5,851,041 A | * | 12/1998 | Anderson et al. | 294/106 |
| 6,609,446 B1 | * | 8/2003 | Ohmi et al. | 82/46 |
| 6,660,089 B2 | * | 12/2003 | Nozawa et al. | 118/500 |
| 6,900,114 B2 | * | 5/2005 | Ohmi et al. | 438/455 |
| 7,579,257 B2 | * | 8/2009 | Yanagita et al. | 438/455 |
| 2003/0019744 A1 | | 1/2003 | Pokorny | |

FOREIGN PATENT DOCUMENTS

JP 07-278820 A 10/1995
JP 2001089851 A 4/2001

OTHER PUBLICATIONS

Chinese Office Action dated Sep. 1, 2011, in related Chinese Patent Application No. 201010126048.9 (with English translation).
Oct. 4, 2013 Japanese Office Action in Japanese Patent Application No. 2010-020734 (with partial English translation).

* cited by examiner

*Primary Examiner* — Saul Rodriguez
*Assistant Examiner* — Brendan Tighe
(74) *Attorney, Agent, or Firm* — Fitzpatrick, Cella, Harper & Scinto

(57) ABSTRACT

A substrate support apparatus has a substrate holding portion to be inserted into a center hole formed in a substrate to support the substrate in a vertical orientation, and includes a first connecting plate connected to the substrate holding portion and a second connecting plate which faces the first connecting plate and is connectable to a transport robot that transports the substrate to a substrate holder. In addition, a shock absorbing member is arranged between the first connecting plate and the second connecting plate so as to allow a movement of the first connecting plate relative to the second connecting plate in horizontal and vertical directions. Support members are configured to connect the first connecting plate to the second connecting plate while allowing the movement of the first connecting plate relative to the second connecting plate.

12 Claims, 10 Drawing Sheets

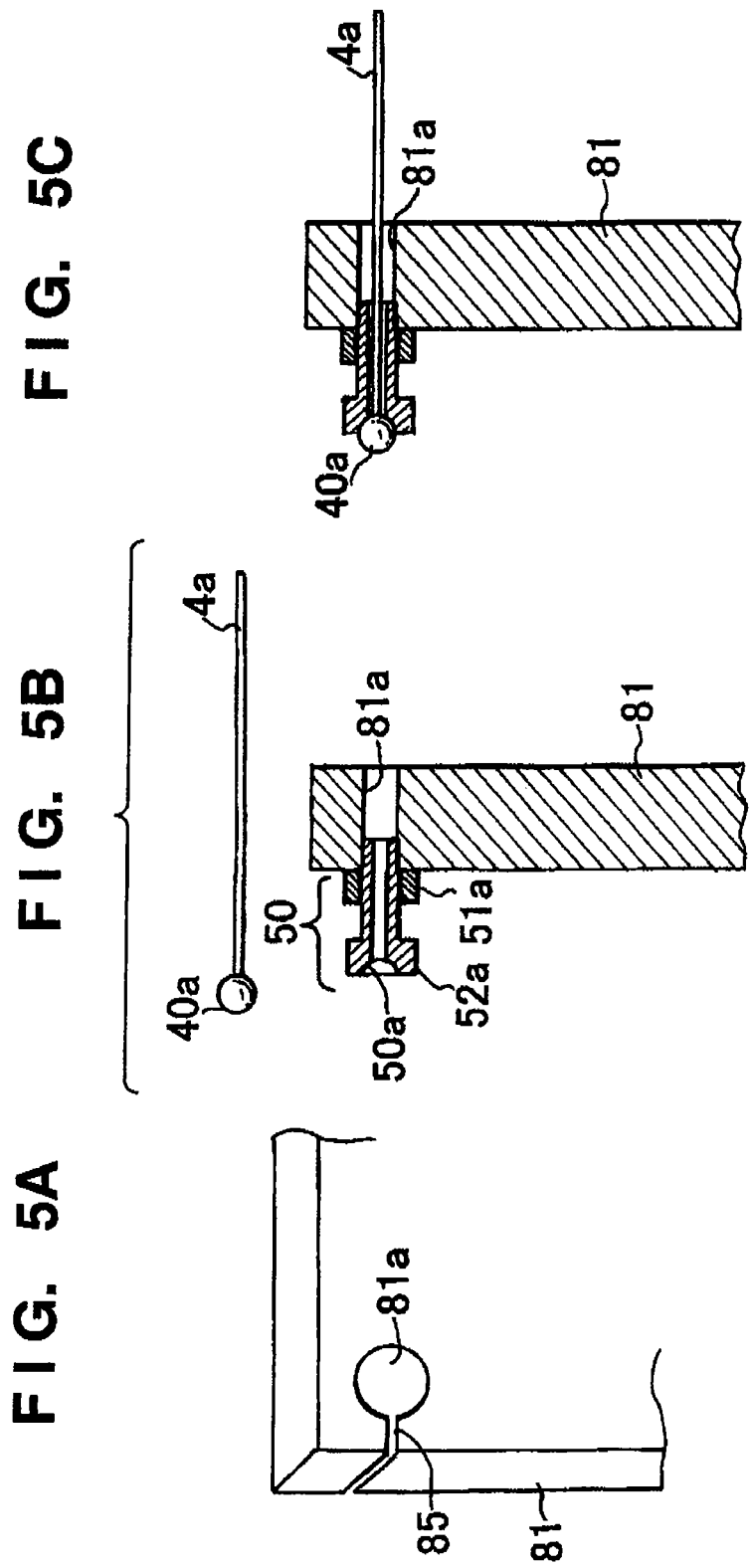

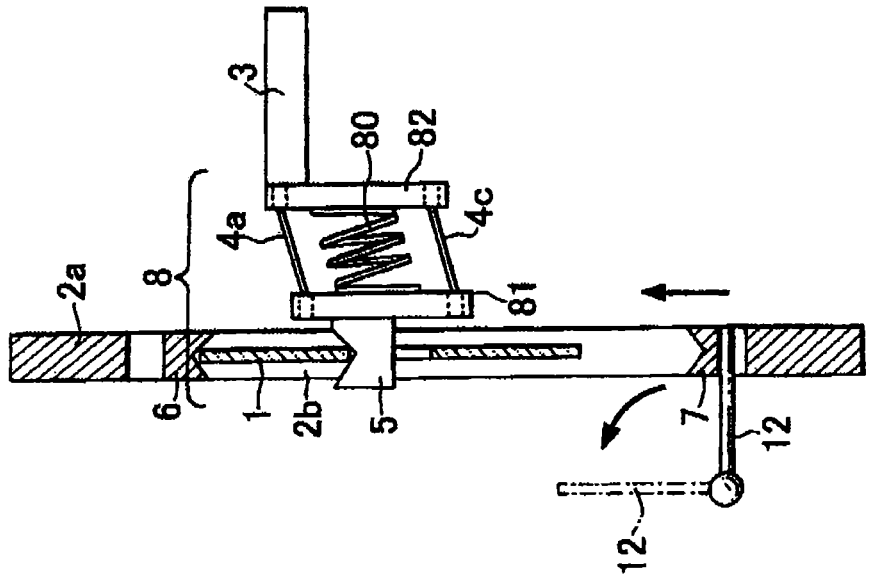
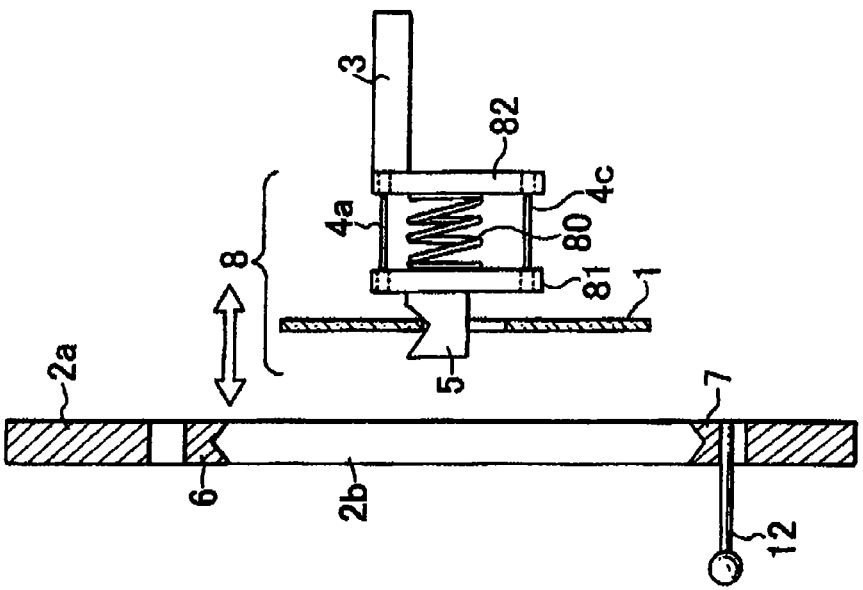

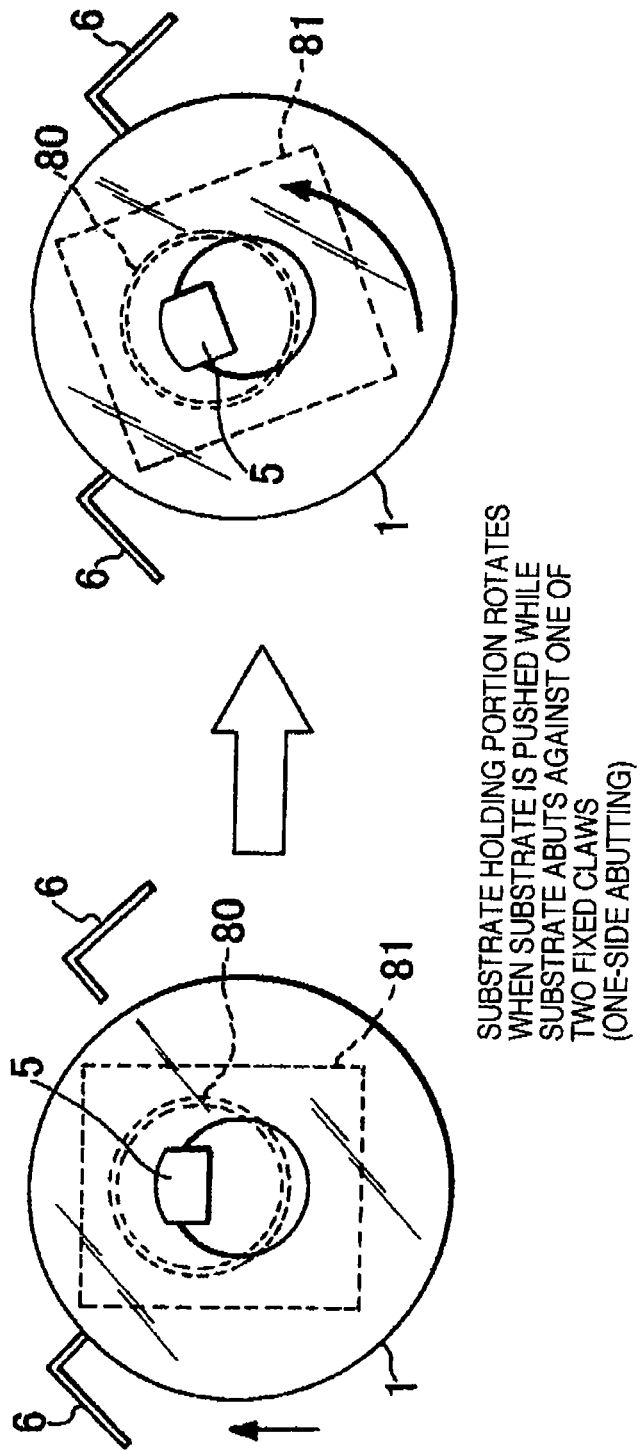

_US 8,770,906 B2_

SUBSTRATE SUPPORT APPARATUS AND SUBSTRATE TRANSPORT APPARATUS HAVING SHOCK ABSORPTION

BACKGROUND OF THE INVENTION

1. Field of the Invention

The present invention relates to a substrate support apparatus which supports, for example, a substrate for a hard disk (magnetic storage medium), a substrate transport apparatus, and an electrical device manufacturing method.

2. Description of the Related Art

To transport a substrate (e.g., a hard disk substrate) including a center hole at its center while it is vertically oriented, a conventional method supports the substrate by inserting a substrate support apparatus including a V-shaped groove into the center hole, and transports the substrate together with the substrate support apparatus by a transport robot. Unfortunately, it is often the case that, in the process of attaching the substrate supported in a vertical orientation in this way, the transport robot excessively presses the substrate against a fixed claw in the attachment hole and the fixed claw damages the outer periphery of the substrate.

In order to solve the above-mentioned problem, Japanese Patent Laid-Open No. 2001-89851 proposes a substrate support apparatus which supports a substrate on a substrate holding portion with the aid of a shock absorbing mechanism.

Along with the recent diversification in both the material and size of substrates, a more flexible shock absorbing mechanism has become necessary. More specifically, when the substrate used is softer than the fixed claw, a more elastic shock absorbing mechanism has become necessary to attach the substrate to the substrate holder without damaging the outer periphery of the substrate. In addition, because the substrate mass decreases with reducing substrate size, a substrate attachment shock absorbing mechanism with a flexibility which equals the substrate mass, i.e., with a higher elasticity, has become necessary.

SUMMARY OF THE INVENTION

It is an object of the present invention to provide a substrate support apparatus which can improve its shock absorption effect, and a substrate transport apparatus using the same.

One aspect of the invention provides a substrate support apparatus which inserts a substrate holding portion into a center hole formed in a substrate, and supports the substrate in a vertical orientation by the substrate holding portion, the apparatus comprising a first connecting plate connected to the substrate holding portion, a second connecting plate which faces the first connecting plate and is connected to a transport robot that transports the substrate to a substrate holder, at least three linear support members configured to connect the first connecting plate to the second connecting plate, and an elastic shock absorbing member inserted between the first connecting plate and the second connecting plate.

According to the present invention, it is possible to reduce an external force acting on a substrate when the substrate is attached to a substrate holder, thus reliably preventing the outer periphery of the substrate from damaging and breaking even when the attached substrate is softer than a fixed claw.

Further features of the present invention will become apparent from the following description of exemplary embodiments with reference to the attached drawings.

BRIEF DESCRIPTION OF THE DRAWINGS

FIGS. 5A, 5B, and 5C are views for explaining the structure, in which a connecting plate and a support member are connected to each other, of the substrate support apparatus according to the present invention;

FIGS. 6A and 6B are views for explaining an operation of transferring a substrate into a substrate attachment hole in a substrate holder by the substrate transport apparatus according to the present invention;

FIGS. 7A and 7B are views for explaining the operation from when the substrate abuts against only one fixed claw until it is pushed against two fixed claws;

DESCRIPTION OF THE EMBODIMENTS

Figure 1:
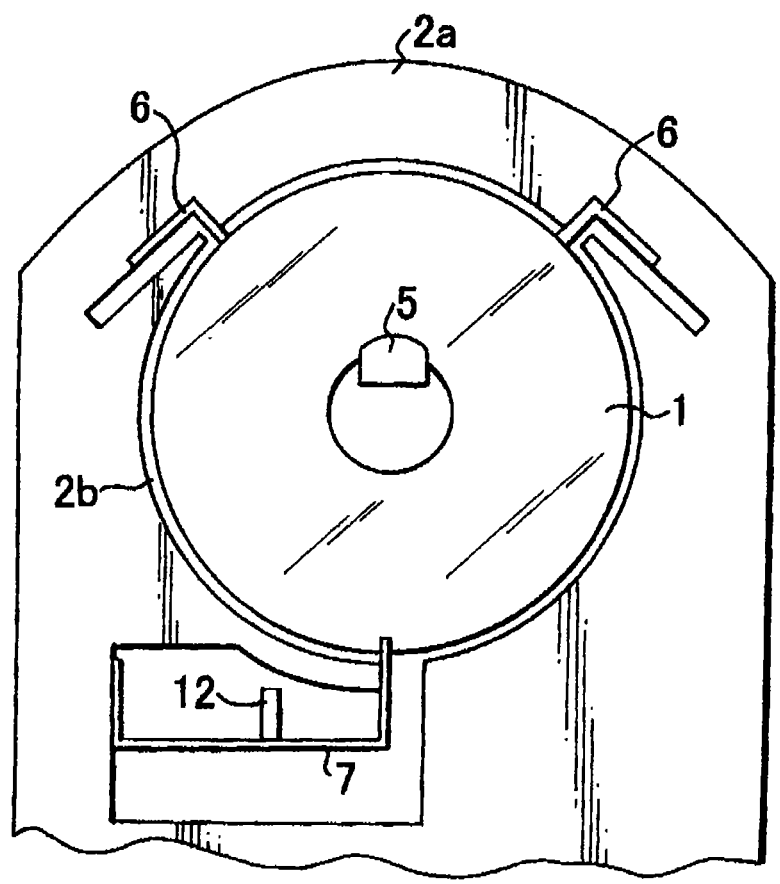
FIG. 1 is a front view showing a substrate holder according to the present invention.

Modes for carrying out the invention will be described in detail below with reference to the accompanying drawings. FIG. 1 is a view showing the arrangement of a substrate holder which holds a substrate. Note that FIG. 1 is a front view of the substrate holder while the substrate is attached on it. As shown in FIG. 1, a substrate holder 2a includes a substrate attachment hole 2b to which a substrate 1 is attached, and two fixed claws 6 to support the substrate 1 in the substrate attachment hole 2b. Also, the substrate holder 2a includes a movable claw 7 to allow inserting/removing the substrate 1 into/from the substrate attachment hole 2b, and a movable claw driving mechanism (to be simply referred to as a driving mechanism hereinafter) 12 to drive the movable claw 7.

The substrate 1 can be a disk-like hard disk substrate including a center hole at its center, as shown in FIG. 1. A substrate transport robot (to be simply referred to as a transport robot hereinafter) 3 is manipulated to insert a substrate holding portion 5 including a V-shaped groove into the center hole in the substrate 1, and to transport the substrate 1 while it is supported in a vertical orientation. Although this embodiment will exemplify a hard disk substrate, the present invention is not limited to this, and can be exploited to support and transport all types of substrates whose center holes are supported by the substrate holding portion.

Figure 2A:
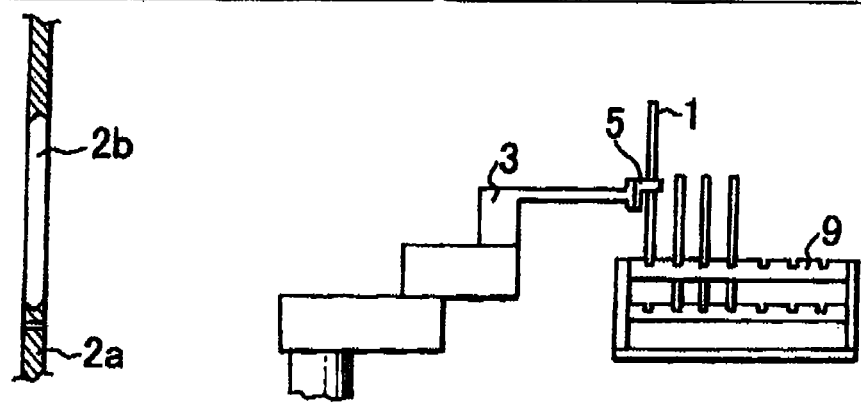
FIGS. 2A, 2B, and 2C are views for explaining the processes from when a substrate is picked up from a substrate cassette by a substrate transport apparatus according to the present invention until it is attached to the substrate holder.
Figure 2B:
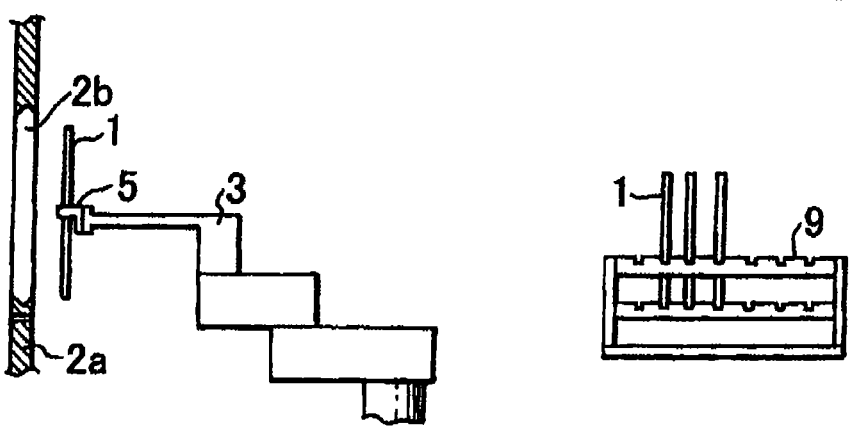
Figure 2C:
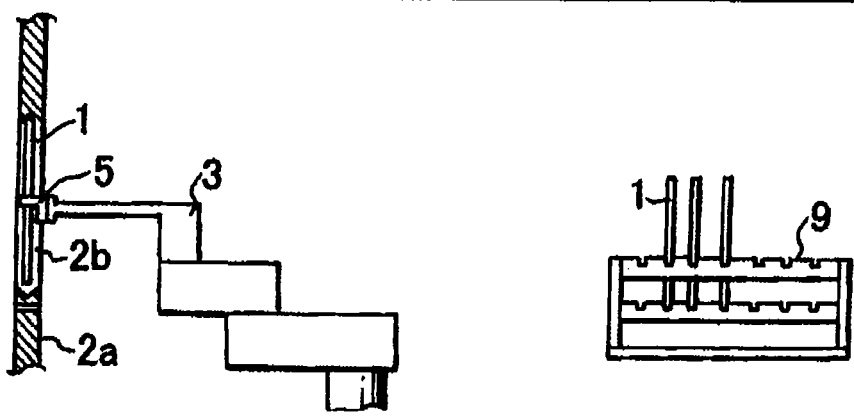

A process for attaching the substrate 1 to the substrate holder 2a by the substrate transport robot 3 will be described next with reference to FIGS. 1 and 2A to 2C. FIG. 2A shows the state in which a substrate transport apparatus according to an embodiment of the present invention picks up the substrate 1 while it is vertically oriented. FIG. 2B shows the state in which the substrate 1 is moved toward the substrate holder 2a by pivoting the substrate transport robot 3. FIG. 2C shows the state in which the substrate 1 is transferred into the substrate attachment hole 2b in the substrate holder 2a.

First, as shown in FIG. 2A, the substrate transport robot 3 supports the substrate 1 by inserting the substrate holding portion 5 mounted at the distal end of the substrate transport robot 3 into the center hole in the substrate 1 accommodated in the substrate cassette 9. The substrate transport robot 3 pivots in the direction of the substrate holder 2a, as shown in FIG. 2B, while supporting the substrate 1, thereby moving the substrate 1. At this time, the driving mechanism 12 keeps the movable claw 7 of the substrate holder 2a shown in FIG. 1 pushed down.

As shown in FIG. 2C, the substrate transport robot 3 moves the substrate 1 toward the substrate holder 2a and inserts the substrate 1 into the substrate attachment hole 2b. The substrate transport robot 3 then pushes the substrate 1 against the upper fixed claws 6. Lastly, the substrate transport robot 3 cancels the push-down of the movable claw 7 kept pushed down by the driving mechanism 12, and pushes up the movable claw 7 to support the substrate 1 by both the fixed claws 6 and movable claw 7, and the attachment of the substrate 1 is completed. Note that FIGS. 2A to 2C are views for explaining a substrate transport process and therefore do not show details of the structure involved.

Figure 3:
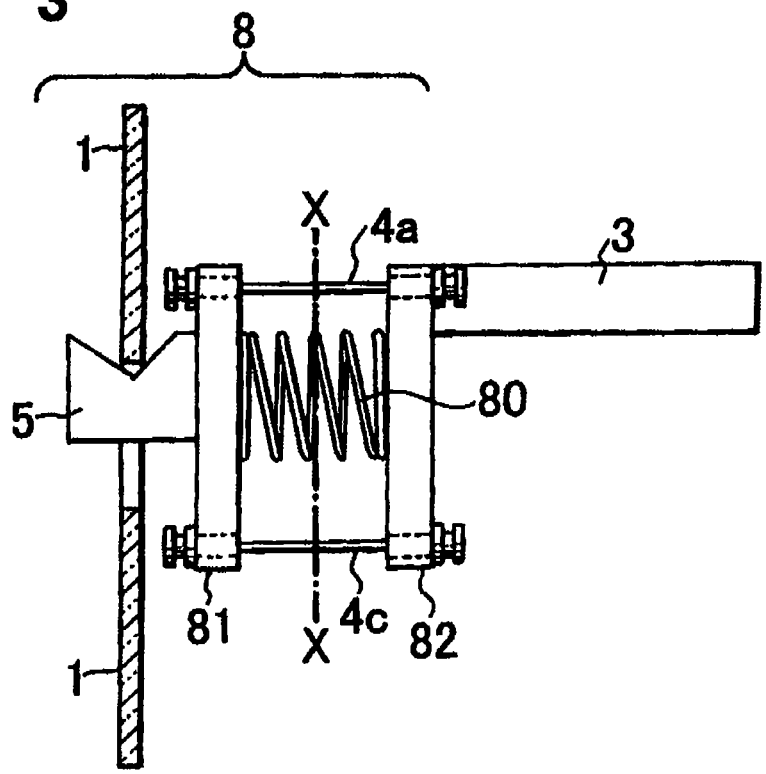
FIG. 3 is a side sectional view showing a substrate support apparatus according to the present invention.
Figure 4:
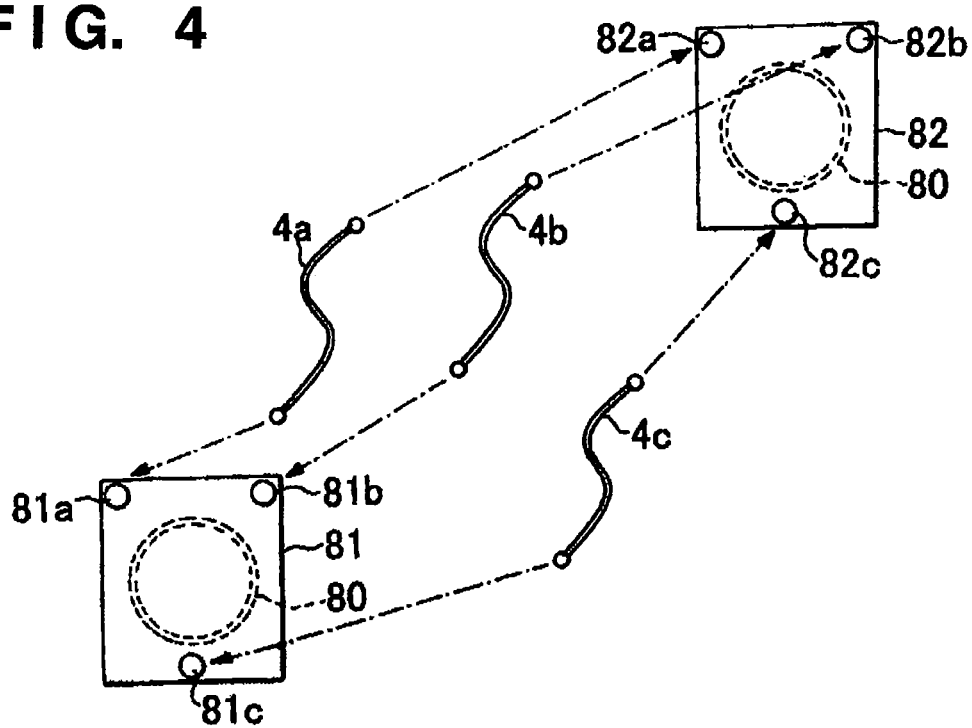
FIG. 4 is an exploded sectional view taken along a line X-X in FIG. 3.

FIG. 3 is a side sectional view showing a substrate support apparatus according to an embodiment of the present invention. FIG. 4 is an exploded sectional view showing an exploded cross-section taken along a line X-X in FIG. 3. The same reference numerals as in FIGS. 1 and 2A to 2C denote the same parts in FIG. 3. The substrate support apparatus according to this embodiment includes a shock absorbing mechanism for preventing the substrate 1 from damaging when the substrate 1 is pushed against the fixed claws 6 by the substrate transport robot 3 in order to attach the substrate 1 to the substrate holder 2a. This shock absorbing mechanism is obtained by improving the shock absorbing mechanism described in Japanese Patent Laid-Open No. 2001-89851 mentioned above to reduce an external force acting on the substrate 1 when the substrate 1 is attached to the substrate holder 2a, thus reliably preventing the substrate 1 from damaging and breaking.

As shown in FIGS. 3 and 4, a substrate support apparatus 8 includes a first connecting plate 81 fixed on the substrate holding portion 5 including a V-shaped groove, and a second connecting plate 82 which faces the first connecting plate 81. The second connecting plate 82 is fixed at the distal end of the arm of the substrate transport robot 3. The first connecting plate 81 and second connecting plate 82 are connected through a plurality of linear (cord-like) support members 4a, 4b, and 4c. An elastic shock absorbing member 80 is inserted between the first and second connecting plates 81 and 82.

The plurality of support members 4a, 4b, and 4c have the same length, high strength, and inelasticity (or low elasticity). The shock absorbing member 80 is inserted between the first and second connecting plates 81 and 82, which receive tensile forces attributed to the elastic force (spring restoring force) of the shock absorbing member 80. Hence, as shown in FIG. 3, the plurality of support members 4a, 4b, and 4c limit movements of the first and second connecting plates 81 and 82 in directions away from each other, and connect the two connecting plates 81 and 82 while being pulled by the restoring force of the shock absorbing member 80, thus keeping balance in this state.

As shown in FIG. 4, the first connecting plate 81 includes a first hole 81a, second hole 81b, and third hole 81c formed in it, and the second connecting plate 82 includes a fourth hole 82a, fifth hole 82b, and sixth hole 82c formed in it to face the first hole 81a, second hole 81b, and third hole 81c, respectively. The first connecting plate 81 and second connecting plate 82 are connected to each other by the linear (cord-like) first support member 4a, second support member 4b, and third support member 4c with the same length.

That is, locking portions where the first support member 4a is locked into the first connecting plate 81 and second connecting plate 82 are formed at the two ends of the first support member 4a. The first support member 4a has its one end inserted in the first hole 81a in the first connecting plate 81, and its other end inserted in the fourth hole 82a in the second connecting plate 82, and the locking portions at the two ends of the first support member 4a are locked into the side surfaces of the respective connecting plates. With this structure, the first support member 4a is connected between the first and second connecting plates 81 and 82.

Similarly, locking portions are formed at the two ends of the second support member 4b. The second support member 4b has its one end inserted in the second hole 81b in the first connecting plate 81, and its other end inserted in the fifth hole 82b in the second connecting plate 82, and the locking portions formed at the two ends of the second support member 4b are locked into the side surfaces of the respective connecting plates. With this structure, the second support member 4b is connected between the first and second connecting plates 81 and 82.

Again similarly, locking portions are formed at the two ends of the third support member 4c. The third support member 4c has its one end inserted in the third hole 81c in the first connecting plate 81, and its other end inserted in the sixth hole 82c in the second connecting plate 82, and the locking portions formed at the two ends of the third support member 4c are locked into the side surfaces of the respective connecting plates. With this structure, the third support member 4c is connected between the first and second connecting plates 81 and 82. Note that the substrate holding portion 5 is positioned at the center of a triangle formed by connecting the first hole 81a, fifth hole 82b, and third hole 81c in the first connecting plate 81.

A support structure which uses, e.g., linear (cord-like) support members that connect the first and second connecting plates 81 and 82 and a shock absorbing member like this damps an excessive pressing force of the substrate transport robot 3 when the substrate 1 is attached to the substrate holder 2a, thereby preventing the substrate 1 held on the substrate holding portion 5 from breaking and damaging. The structure in which the first and second connecting plates 81 and 82 are connected to at least three support members 4a, 4b, and 4c will be described in detail later.

Although the first connecting plate 81 and second connecting plate 82 are set in FIGS. 3 and 4, the substrate holding portion 5 and first connecting plate 81 may be integrated with each other, and the substrate transport robot 3 and second connecting plate 82 may be integrated with each other (see, for example, FIG. 3 in Japanese Patent Laid-Open No. 2001-89851). Also, the shock absorbing member 80 need only be elastic and is preferably a coil spring.

Further, the first support member 4a, second support member 4b, and third support member 4c may have low elasticity but are desirably inelastic. In this embodiment, one cord-like inelastic support member is fabricated by intertwining a multiple of thin stainless steel wires.

This structure serves to obtain a cord-like inelastic support member which not only can ensure high strength but also can be freely bent and folded. The inelasticity of the support member means herein the incapability of restoring its original shape again when an external force acting on it is removed. In this example, a cord-like support member fabricated by intertwining a multiple of thin metal wires is used. As a matter of course, since the support member limits movement of the first and second connecting plates 81 and 82 which receive forces in directions away from each other due to the elastic force of the shock absorbing member 80, as described above, a low-elasticity support member with a little elasticity may be used. Also, although the three support members 4a, 4b, and 4c are used, at least three support members need only be present.

FIGS. 5A to 5C are views for explaining the structure in which the first and second connecting plates 81 and 82 are connected to each other by at least three linear (cord-like) support members. FIG. 5A is an enlarged perspective view of the first hole 81a formed in the first connecting plate 81. A cut 85 to insert the first support member 4a into the first hole 81a is formed in the side surface of the first connecting plate 81.

FIG. 5B shows the structure in which the first support member 4a is connected to the first connecting plate 81. A locking portion 50 for locking the first support member 4a into the first connecting plate 81 includes a bolt-shaped fixing tool 52a and internal threaded portion 51a. An external threaded portion of the bolt-shaped fixing tool 52a is screwed into the internal threaded portion formed in the first connecting plate 81. The internal threaded portion 51a meshes with the external threaded portion of the bolt-shaped fixing tool 52a. The bolt-shaped fixing tool 52a includes a through hole formed at its center, and a cut (not shown), formed in it, to insert the first support member 4a into the through hole. The bolt-shaped fixing tool 52a has its position which can be adjusted relative to the first connecting plate 81 in its axial direction, and includes an adjusting mechanism which adjusts the interval between the first and second connecting plates 81 and 82.

The internal threaded portion 51a also includes a cut (not shown), formed in it, to insert the first support member 4a, and the first support member 4a can be inserted into the through hole in the bolt-shaped fixing tool 52a by rotating the internal threaded portion 51a. As shown in FIG. 5B, the first support member 4a includes a spherical portion (locking portion) 40a formed at its one end, which is connected to the first connecting plate 81 by locking into the recess at the end of the bolt-shaped fixing tool 52a. Although the end of the first support member 4a is formed in a spherical shape, the present invention is not limited to this, and this end may have another structure formed in, e.g., a bowl shape or a conical shape. The same applies to other support members.

In this manner, the first support member 4a can be inserted into both the through hole in the bolt-shaped fixing tool 52a and the first hole 81a, as shown in FIG. 5C, by aligning the cut in the bolt-shaped fixing tool 52a, the cut in the internal threaded portion 51a, and the cut 85 formed in the side surface of the first connecting plate 81. The first hole 81a in the first connecting plate 81 has a diameter (play) large enough to allow the first support member 4a to move through the first hole 81a. This is to allow the support members 4a, 4b, and 4c to move within the through holes in the first and second connecting plates 81 and 82 to some extent even when the substrate support apparatus 8 bends upon inserting the substrate 1 into the substrate attachment hole 2b, as shown in FIG. 6B, thus preventing any trouble in the substrate attachment operation. The same applies to other through holes in the first and second connecting plates 81 and 82. After that, the internal threaded portion 51a is clamped down on the first connecting plate 81, and the connection of the first support member 4a is completed.

The first support member 4a includes a spherical portion (locking portion) 40a formed at its other end as well, and a cut to insert the first support member 4a into the fourth hole 82a is formed in the side surface of the second connecting plate 82 as well. The second connecting plate 82 need only include a cut formed in it and need not always include a bolt-shaped fixing tool and other components. The spherical portion (locking portion) 40a at the other end of the first support member 4a is locked into the second connecting plate 82 by inserting the other end of the first support member 4a into the fourth hole 82a in the second connecting plate 82 from the cut in the second connecting plate 82. Note that the second connecting plate 82 includes a recess which engages with the spherical portion 40a of the first support member 4a at its other end as well.

In this way, the first support member 4a can be connected between the first and second connecting plates 81 and 82. The second support member 4b and third support member 4c are connected between the two connecting plates in precisely the same way. In this case, because the shock absorbing member 80 is inserted between the first connecting plate 81 and the second connecting plate 82, the first, second, and third support members 4a, 4b, and 4c are connected between them while being pulled by the restoring force of the shock absorbing member 80.

The position of the bolt-shaped fixing tool 52a can be adjusted relative to the first connecting plate 81 in its axial direction by the adjusting mechanism, as described above. This adjusting mechanism can adjust the restoring force of the shock absorbing member 80 by adjusting the interval between the first and second connecting plates 81 and 82. As a matter of course, the same applies to all bolt-shaped fixing tools 52a.

The adjusting mechanism can have a structure in which the bolt-shaped fixing tool 52a moves forward/backward relative to the first connecting plate 81 in its axial direction by a screw mechanism (a structure in which the external threaded portion of the bolt-shaped fixing tool 52a is screwed into the internal threaded portion of the first hole 81a in the first connecting plate 81), as shown in FIGS. 5B and 5C. In contrast, the internal threaded portion 51a meshes with the external threaded portion of the bolt-shaped fixing tool 52a. When the internal threaded portion 51a is rotated in the direction to loosen in FIG. 5B, the bolt-shaped fixing tool 52a becomes free and therefore can move forward/backward in its axial direction.

In this state, the position of the bolt-shaped fixing tool 52a relative to the first connecting plate 81 in its axial direction is adjusted. After this adjustment is completed, the internal threaded portion 51a is clamped down on the first connecting plate 81. In this state, the bolt-shaped fixing tool 52a is fixed in position, and all the adjustment operations are completed. The same applies to adjustment of other bolt-shaped fixing tools 52a.

In this manner, the distance between the first connecting plate 81 and the second connecting plate 82 can be adjusted by adjusting the position of the bolt-shaped fixing tool 52a relative to the first connecting plate 81 in its axial direction. That is, because the lengths of the spherical portions of the support member on both sides are determined in advance, the distance between the first connecting plate 81 and the second connecting plate 82 decreases if the position of the bolt-shaped fixing tool 52a relative to the first connecting plate 81 in its axial direction is adjusted in the direction in which the external threaded portion of the bolt-shaped fixing tool 52a loosens. Conversely, the distance between the first connecting plate 81 and the second connecting plate 82 increases if the position of the bolt-shaped fixing tool 52a relative to the first connecting plate 81 in its axial direction is adjusted in the direction in which the external threaded portion of the bolt-shaped fixing tool 52a tightens.

Although a case in which the locking portion 50 including the bolt-shaped fixing tool 52a and other components is located on the first connecting plate 81 has been exemplified, the locking portion 50 need only be located on at least one of the first and second connecting plates 81 and 82. Also, although the locking portion 50 including the bolt-shaped fixing tool 52a and other components is located on at least one of the first and second connecting plates 81 and 82 in that case, the locking portion 50 including the bolt-shaped fixing tool 52a and other components is not always necessary, and recesses which engage with the spherical portions of each support member may be formed in the side surfaces of the first and second connecting plates 81 and 82. Note that the substrate support apparatus shown in FIG. 3 exemplifies an arrangement in which the locking portion 50 including the bolt-shaped fixing tool 52a and other components is located on each of the first and second connecting plates 81 and 82.

An operation of attaching the substrate 1 to the substrate holder 2a using the substrate support apparatus according to the embodiment of the present invention will be described next with reference to FIGS. 6A, 6B, 7A, and 7B. FIG. 6A shows the state in which the substrate 1 is moved to the substrate holder 2a by the substrate transport robot 3. FIG. 6B shows the state in which the substrate 1 is transferred into the substrate attachment hole 2b in the substrate holder 2a.

FIGS. 7A and 7B are views for explaining an operation of pushing the substrate 1 against the fixed claws 6 of the substrate holder 2a by the substrate support apparatus according to the embodiment of the present invention. The same reference numerals as in FIGS. 1 to 4 denote the same parts in FIGS. 6A, 6B, 7A, and 7B.

First, as described above, a substrate 1 is picked up from the substrate cassette 9 by the substrate transport robot 3 and moved to the substrate holder 2a by the substrate transport robot 3, as shown in FIG. 6A, while being held on the substrate holding portion 5 in a vertical orientation. The foregoing description is the same as in FIGS. 2A and 2B.

Next, as shown in FIG. 6B, the substrate 1 held on the substrate holding portion 5 in a vertical orientation by the substrate transport robot 3 is inserted into the substrate attachment hole 2b. After that, the substrate 1 is lifted up while being held on the substrate holding portion 5, and has its outer periphery pressed against the fixed claws 6 in the substrate attachment hole 2b. At this time, the driving mechanism 12 keeps the movable claw 7 pushed down. Assume herein that the substrate 1 does not simultaneously abut against the two fixed claws 6, as shown in FIG. 7A. In this case, when the substrate 1 is pushed against the fixed claws 6 while it abuts against one of the two fixed claws 6, the substrate holding portion 5 rotates in the direction indicated by an arrow, as shown in FIG. 7B.

In other words, because the two connecting plates 81 and 82 are connected to each other by the three or more support members 4a, 4b, and 4c, and the shock absorbing member 80 is inserted between the two connecting plates 81 and 82, the substrate holding portion 5 rotates about the contact point, between the substrate 1 and the fixed claw 6 against which the substrate 1 abuts first, as a fulcrum, and the substrate 1, in turn, rotates or moves laterally. The shock absorbing member 80 is elastic not only in the vertical direction but also in the horizontal direction or the direction of twisting. With this function, the substrate 1 is pressed against the two fixed claws 6 by appropriate forces, and therefore the outer peripheral surface of the substrate 1 never damages. That is, since an external force acting on the substrate 1 is reduced in that case, it is possible to prevent the substrate 1 from damaging and breaking even when the substrate 1 is softer than the fixed claws 6, thus stably attaching the substrate 1 to the substrate holder 2a.

When the substrate 1 is pushed against the two fixed claws 6 in the substrate attachment hole 2b, the movable claw 7 kept pushed down by the driving mechanism 12 is released and moves in the direction indicated by an arrow to support the substrate 1 from below, as shown in FIG. 6B. In this way, the substrate 1 is supported by both the two fixed claws 6 and the single movable claw 7 in the substrate attachment hole 2b, and the attachment of the substrate 1 to the substrate holder 2a is completed.

In this embodiment, it is possible to reduce an external force acting on the substrate 1, as described above, thus reliably preventing the substrate 1 from damaging and breaking. This, in turn, makes it possible not only to perform a deposition process and other processes at a high throughput but also to widen the tolerances of the substrate transfer position precision and the elasticity and material of the substrate support claws. It is also possible to connect a plurality of substrate support apparatuses. It is moreover possible to compensate for, thermal expansion of the substrate holder 2a attributed to a high-temperature process and errors attributed to processing/assembly of the apparatus, by the mechanisms of, e.g., the shock absorbing member 80. This obviates the need to precisely adjust the substrate transfer position, and therefore allows simple adjustment of the transport mechanism.

Figure 8:
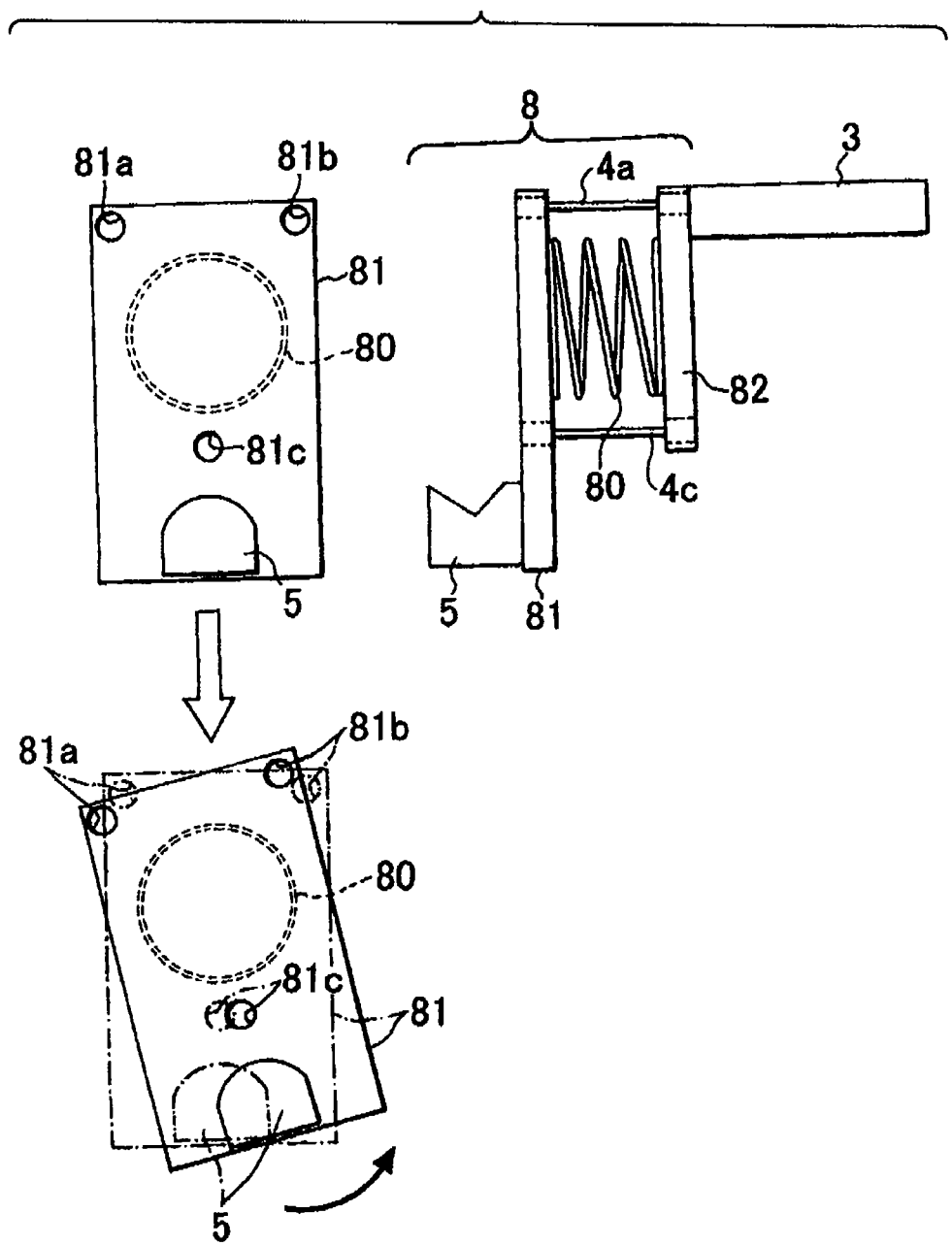
FIG. 8 is a view illustrating another example of the attachment position of a substrate holding portion.

Although the substrate holding portion 5 is positioned at the center of a triangle formed by connecting the first hole 81a, second hole 81b, and third hole 81c in the first connecting plate 81 in the above-mentioned embodiment, it may be positioned on the lower side of the third hole 81c, as shown in FIG. 8. This makes it possible to increase the amount of movement of the substrate holding portion 5 when the transport robot rotates it through the same angle as in the above-mentioned embodiment, thus easily correcting the state in which the substrate 1 abuts against only one fixed claw 6 by a small amount of rotation using the robot.

A magnetic recording medium which exemplifies electrical devices-manufactured by an electrical device manufacturing apparatus and electrical device manufacturing method according to an embodiment of the present invention will be described below. Note that in this specification, a "magnetic recording medium" is not limited to, e.g., a hard disk which uses only magnetism to record and read information and optical disks such as a Floppy® disk. A "magnetic recording medium" includes, for example, magnetooptical recording media such as an MO (Magneto Optical disk), which use both magnetism and light, and thermal assisted recording media which use both magnetism and heat.

Figure 9:
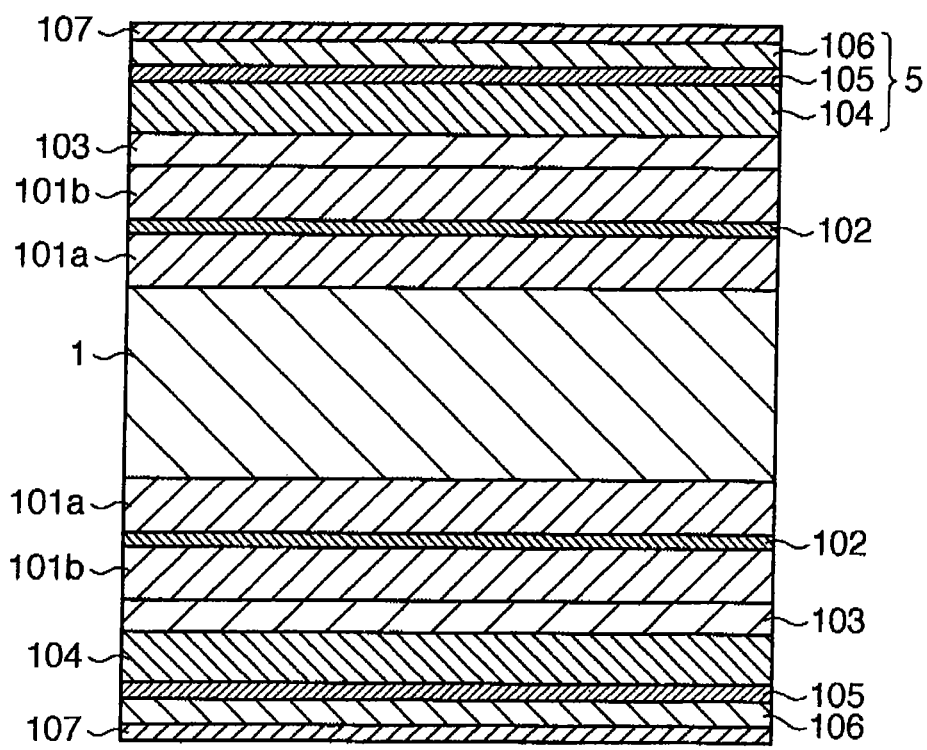
FIG. 9 is a schematic longitudinal sectional view illustrating one example of magnetic recording media manufactured by a magnetic recording medium manufacturing method according to an embodiment of the present invention.

FIG. 9 is a schematic sectional view illustrating one example of magnetic recording media (thin film stacked bodies) manufactured by a magnetic recording medium manufacturing apparatus and magnetic recording medium manufacturing method according to an embodiment of the present invention. Although this embodiment will exemplify an ECC (Exchange-Coupled Composite) medium as an improved product of a perpendicular recording medium as the magnetic recording medium to be manufactured, the gist of the present invention is not particularly limited to this example. The magnetic recording medium to be manufactured in this embodiment may be, for example, a general perpendicular recording medium, a longitudinal recording medium, a bit-patterned medium, or a thermal assisted recording medium.

As shown in FIG. 9, the magnetic recording medium includes, for example, a substrate 1, and a first soft magnetic layer 101a, spacer layer 102, second soft magnetic layer 101b, seed layer 103, magnetic layer 104, exchange coupling control layer 105, third soft magnetic layer 106, and protective layer 107, which are sequentially stacked on one or both surfaces of the substrate 1.

The substrate 1 can be made of a nonmagnetic material generally used as a magnetic recording medium substrate, such as glass, an Al alloy including an NiP plating film formed on it, ceramics, a flexible resin, or Si. Although the substrate 1 in this embodiment is a disk-like member including a hole at its center, it is not limited to this, and may be, for example, a rectangular member.

The first soft magnetic layer 101a is formed on the substrate 1 in order to improve recording/playback characteristics by controlling a magnetic flux from a magnetic head for use in magnetic recording, but can also be omitted. A material such as CoZrNb, CoZrTa, or FeCoBCr can be used to form the first soft magnetic layer 101a in accordance with the material of a film formed immediately above it.

The spacer layer 102 can be made of a material such as Ru or Cr. The second soft magnetic layer 101b formed on the spacer layer 102 is identical to the first soft magnetic layer 101a. The first soft magnetic layer 101a, spacer layer 102, and second soft magnetic layer 101b form a soft underlayer.

The seed layer 103 formed on the soft underlayer is present immediately under the magnetic layer 104 in order to suitably control the crystal orientation, crystal grain size, grain size distribution, and grain boundary segregation of the magnetic layer 104. The seed layer 103 can be made of a material such as MgO, Cr, Ru, Pt, or Pd.

The substrate holding portion 5 includes the magnetic layer 104 with a high Ku value, the exchange coupling control layer 105, and the third soft magnetic layer 106 with a low Ku value.

The magnetic layer 104 which is formed on the seed layer 103 and has a high Ku value accounts for the overall Ku value of the substrate holding portion 5 and therefore is made of a material with a Ku value as high as possible. The magnetic layer 104 can be made of a material which has an easy magnetization axis perpendicular to the substrate surface and has a structure in which ferromagnetic particles are separated by nonmagnetic grain boundary components of an oxide. The magnetic layer 104 can be made of, for example, a material produced by adding an oxide to a ferromagnetic material containing at least CoPt, such as CoPtCr—$SiO_2$ or CoPt—$SiO_2$. Alternatively, the magnetic layer 104 may be made of $Co_{50}Pt_{50}$, $Fe_{50}Pt_{50}$, or $CO_{50-y}Fe_yPt_{50}$.

The exchange coupling control layer 105 formed on the magnetic layer 104 contains a crystalline metal or alloy and an oxide. The crystalline metal or alloy can be, for example, Pt, Pd, or an alloy thereof. Alternatively, the crystalline alloy can be, for example, an alloy of an element selected from Co, Ni, and Fe and a nonmagnetic metal.

The strength of the exchange coupling force between the magnetic layer 104 and the third soft magnetic layer 106 can be most simply controlled by changing the thickness of the exchange coupling control layer 105. The thickness of the exchange coupling control layer 105 is, for example, 0.5 to 2.0 nm.

The third soft magnetic layer 106 formed on the exchange coupling control layer 105 plays a major role in reducing a reverse magnetization field, so it is made of a material with a Ku value as low as possible. The third soft magnetic layer 106 can be made of a material such as Co, NiFe, or CoNiFe.

The protective layer 107 is formed on the third soft magnetic layer 106 in order to prevent any damage attributed to contact between the head and the medium surface. The protective layer 107 can be made of, for example, a material which contains a single component such as C, $SiO_2$, or $ZrO_2$ or all of them as major components and an additive element.

Figure 10:
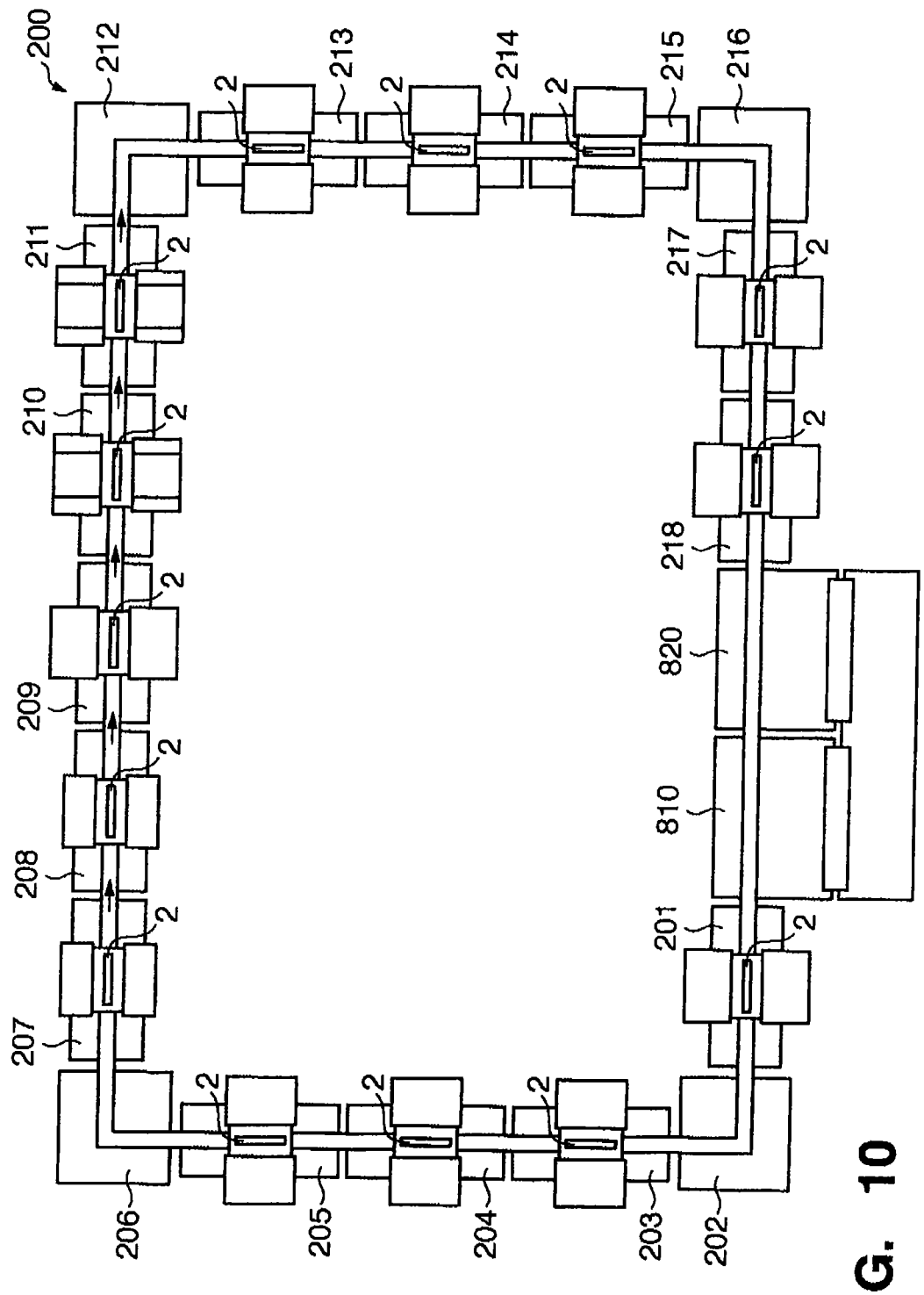
FIG. 10 is a schematic view illustrating one example of thin film forming apparatuses (magnetic recording medium manufacturing apparatuses) according to an embodiment of the present invention.

A thin film forming apparatus (to be also referred to as a "magnetic recording medium manufacturing apparatus" hereinafter) for use in the magnetic recording medium manufacturing method according to an embodiment of the present invention will be described next. FIG. 10 is a schematic view illustrating one example of magnetic recording medium manufacturing apparatuses according to an embodiment of the present invention.

As shown in FIG. 10, in the magnetic recording medium manufacturing apparatus, a load lock chamber 810 for mounting a substrate 1 (FIG. 9) on a carrier 2, an unload lock chamber 820 for recovering the substrate 1 from the carrier 2, and a plurality of chambers 201, 202, 203, 204, 205, 206, 207, 208, 209, 210, 211, 212, 213, 214, 215, 216, 217, and 218 are arranged in a rectangular pattern. Also, a transport path is formed along the load lock chamber 810, chambers 201 to 218, and unload lock chamber 820. A plurality of carriers 2 which can mount the substrate 1 are set in the transport path. The time (takt time) taken to process the substrate 1 in each chamber is determined advance. After the processing time (takt time) elapses, the substrate 1 mounted on the carrier 2 is sequentially transported to the next chamber.

The carrier 2 includes a transport mechanism which transports a substrate holder 2a across the plurality of chambers. The substrate holder 2a includes a substrate attachment hole 2b to insert the substrate 1, and two fixed claws 6 to support the substrate 1 in the substrate attachment hole 2b, as shown in FIG. 1.

To process about 1,000 substrates per hour by the magnetic recording medium manufacturing apparatus, the takt time in each chamber is about 5 sec or less and is desirably about 3.6 sec or less.

The load lock chamber 810, unload lock chamber 820, and chambers 201, 202, 203, 204, 205, 206, 207, 208, 209, 210, 211, 212, 213, 214, 215, 216, 217, and 218 are vacuum chambers which can be evacuated by dedicated exhaust systems or a common exhaust system. The load lock chamber 810, unload lock chamber 820, and chambers 201, 202, 203, 204, 205, 206, 207, 208, 209, 210, 211, 212, 213, 214, 215, 216, 217, and 218 have their boundary portions provided with gate valves (not shown).

Each of the load lock chamber 810 and unload lock chamber 820 includes a transport robot 3 including a substrate holding portion 5.

More specifically, the chamber 201 of the magnetic recording medium manufacturing apparatus is used to form a first soft magnetic layer 101a on the substrate 1. The direction changing chamber 202 is used to change the direction in which the carrier 2 is transported. The chamber 203 is used to form a spacer layer 102 on the first soft magnetic layer 101a. The chamber 204 is used to form a second soft magnetic layer 101b on the spacer layer 102. The chamber 205 is used to form a seed layer 103 on the second soft magnetic layer 101b. The direction changing chamber 206 is used to change the direction in which the carrier 2 is transported. The chamber 207 (first heating chamber) and chamber 208 (second heating chamber) are used to preheat the substrate 1. Note that the seed layer 103 can also be formed in the chamber 209.

The chambers 210 and 211 can function as a sputtering device for forming a magnetic layer 104 on the seed layer 103. The direction changing chamber 212 is used to change the direction of the carrier 2. The cooling chamber 213 is used to cool the substrate 1. The chamber 214 is used to form an exchange coupling control layer 105 on the magnetic layer 104. The chamber 215 is used to form a third soft magnetic layer 106 on the exchange coupling control layer 105. The direction changing chamber 216 is used to change the direction of the carrier 2. The chambers 217 and 218 are used to form a protective layer 107.

Figure 11:
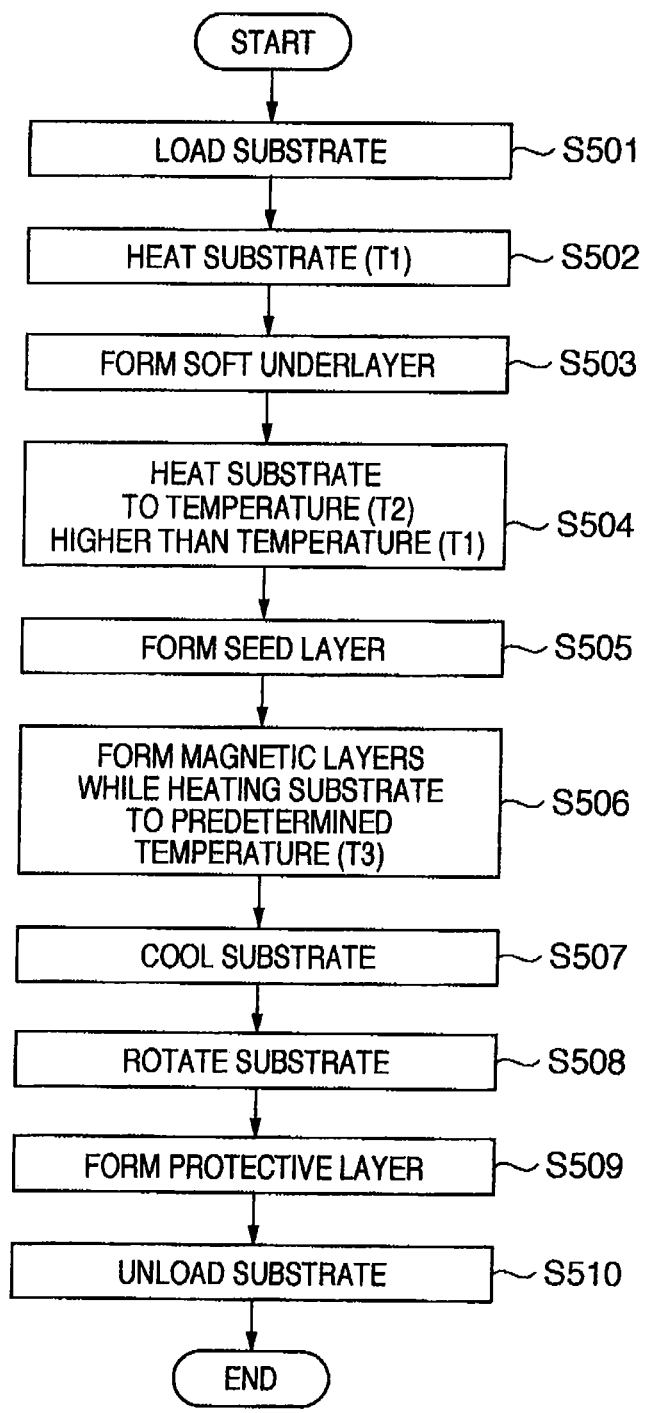
FIG. 11 is a flowchart for explaining the sequence of the magnetic recording medium manufacturing method according to the embodiment of the present invention.

A magnetic recording medium manufacturing method using a magnetic recording medium manufacturing apparatus according to an embodiment of the present invention will be described next with reference to FIGS. 9 and 11.

In step S501, a substrate 1 is loaded into the load lock chamber 810 and mounted on the carrier 2 by the substrate transport robot 3 shown in FIG. 3. As described above, the load lock chamber 810 includes a shock absorbing mechanism for preventing the substrate 1 from damaging when the substrate 1 is pushed against the fixed claws 6 by the substrate transport robot 3. This makes it possible to reduce an external force acting on the substrate 1 when the substrate 1 is attached to the substrate holder 2a, thus reliably preventing the substrate 1 from damaging and breaking.

In step S502, to remove contaminants and moisture adhering on the substrate 1, the substrate 1 is heated to a predetermined temperature T1 (about 100° C.) in the load lock chamber 810.

In step S503, a soft underlayer is formed. More specifically, a first soft magnetic layer 101a is formed in the chamber 201, a spacer layer 102 (Thickness: 0.7 to 2 nm) is formed in the chamber 203, and a second soft magnetic layer 101b is formed in the chamber 204.

In step S504, the substrate 1 is sequentially transported to the chamber 207 (first heating chamber) and chamber 208 (second heating chamber) and is heated to a temperature T2 (about 400° C. to 700° C.) higher than the temperature T1 (about 100° C.) targeted in step S502. This is a preparation process for enhancing the magnetic anisotropy of a substrate holding portion 5 in preparation for the subsequent operation of forming a magnetic layer 104. The magnetic recording medium manufacturing apparatus has a limit of the processing time (takt time) in each chamber in order to improve the throughput. It is difficult to heat the substrate 1 to a temperature required to enhance the magnetic anisotropy of a magnetic layer 104 in the chambers 210 and 211, for forming the magnetic layer 104, within the limited times. To overcome this difficulty, the magnetic recording medium manufacturing apparatus includes the chamber 207 (first heating chamber) and chamber 208 (second heating chamber) for use in preheating. In the magnetic recording medium manufacturing apparatus, the chamber 207 (first heating chamber) and chamber 208 (second heating chamber) function as a preheater.

Taking account of the fact that the temperature of the substrate 1 drops before it is transported to the chamber 210 for forming a magnetic layer 104, the chamber 207 (first heating chamber) and chamber 208 (second heating chamber) need to heat (preheat) the substrate 1 to a required temperature or more in order to enhance the magnetic anisotropy of the magnetic layer 104. However, note that when a glass substrate is excessively heated, it may suffer from plastic deformation and fall from the carrier 2. To avoid this, the substrate 1 is heated to a temperature low enough not to cause plastic deformation of a glass substrate, for example, to 600° C. in the chamber 207 (first heating chamber) and chamber 208 (second heating chamber).

In step S505, a seed layer 103 is formed in order to suitably control the crystal characteristics of the magnetic layer 104. The seed layer 103 may be formed in the chamber 205 before the heating process in step S504.

In step S506, the substrate 1 is transported to the chambers 210 and 211 for forming a magnetic layer 104, and a magnetic layer 104 is formed while heating the substrate 1 to a predetermined temperature T3 (about 400° C. to 600° C.). In this case, the magnetic layer 104 is formed while uniformly heating the substrate 1 in the chamber 210, as described above.

In step S507, the substrate 1 is sequentially transported to the cooling chamber 213 and cooled to a temperature optimum for forming a protective layer 107. When the protective layer 107 is made of carbon, it is necessary to cool the substrate 1 to, for example, about 200° C. or less.

In step S508, the carrier is transported to the chamber 216 including the substrate transport robot 3, and the substrate 1 is rotated, as has been explained with reference to FIGS. 7 and 8. As described above, the chamber 216 includes a shock absorbing mechanism for preventing the substrate 1 from damaging when the substrate 1 is pushed against the fixed claws 6 by the substrate transport robot 3. This makes it possible to reduce an external force acting on the substrate 1 when it is removed from the substrate holder 2a and rotated, thus reliably preventing the substrate 1 from damaging and breaking.

In step S509, the substrate 1 is transported to the CVD chambers 217 and 218, and a protective layer 107 is formed by CVD.

An ultrathin exchange coupling control layer 105 may be formed between the magnetic layer 104 and the protective layer 107 in the chamber 214. Also, a third soft magnetic layer 106 may be formed in the chamber 215 before a protective layer 107 is formed after the substrate 1 is cooled.

In step S510, the substrate 1 is removed from the carrier 2 and unloaded in the unload lock chamber 820. As described above, the unload lock chamber 820 includes a shock absorbing mechanism for preventing the substrate 1 from damaging when the substrate 1 is pushed against the fixed claws 6 by the substrate transport robot 3. This makes it possible to reduce an external force acting on the substrate 1 when it is removed from the substrate holder 2a, thus reliably preventing the substrate 1 from damaging and breaking.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-045597, filed Feb. 27, 2009, Japanese Patent Application No. 2010-020734, filed Feb. 1, 2010, which are hereby incorporated by reference herein in their entirety.

What is claimed is:

1. A substrate support apparatus having a substrate holding portion to be inserted into a center hole formed in a substrate to support the substrate in a vertical orientation, the apparatus comprising:
   a first connecting plate connected to the substrate holding portion;
   a second connecting plate which faces the first connecting plate and is connectable to a transport robot that transports the substrate to a substrate holder;
   a shock absorbing member arranged between the first connecting plate and the second connecting plate so as to allow a movement of the first connecting plate relative to the second connecting plate in horizontal and vertical directions; and support members configured to connect the first connecting plate to the second connecting plate while allowing the movement of the first connecting plate relative to the second connecting plate, wherein the support members (i) are cord-like and (ii) have one of low elasticity and inelasticity.

2. The apparatus according to claim 1, wherein the support members are connected between the first connecting plate and the second connecting plate while being pulled by a restoring force of the shock absorbing member.

3. The apparatus according to claim 1, wherein the support members have an identical length.

4. The apparatus according to claim 1, wherein the shock absorbing member includes a coil spring.

5. The apparatus according to claim 1, wherein at least one of the first connecting plate and the second connecting plate includes an adjusting mechanism configured to adjust an interval between the first connecting plate and the second connecting plate.

6. The apparatus according to claim 1, further comprising:
    locking portions formed at two ends of each of the support members, with through holes to insert the support members and cuts to insert the support members into the through holes formed in each of the first connecting plate and the second connecting plate; and
    bolt-shaped fixing tools for connecting the support members between the first connecting plate and the second connecting plate by locking the locking portions at the two ends of each of the support members into side surfaces of the first connecting plate and the second connecting plate.

7. The apparatus according to claim 6, wherein
    each of the bolt-shaped fixing tools includes a through hole and a cut to insert a corresponding one of the support members, and internal threaded portions each including a cut which meshes with an external threaded portion of a corresponding one of the bolt-shaped fixing tools are disposed on at least one of the first connecting plate and the second connecting plate, and
    each of the support members is inserted into a corresponding set of the through holes in the first connecting plate and the second connecting plate and the through hole in a corresponding one of the bolt-shaped fixing tools by aligning a corresponding set of the cuts in the first connecting plate, the second connecting plate, the bolt-shaped fixing tools, and the internal threaded portions.

8. A substrate transport apparatus comprising:
    a substrate support apparatus defined in claim 1; and
    a transport robot which is connected to the substrate support apparatus and is configured to transport the substrate to the substrate holder.

9. The apparatus according to claim 8, further comprising a substrate attachment hole to attach the substrate to the substrate holder formed in the substrate holder, and a fixed claw to support the substrate and a movable claw to attach/detach the substrate mounted in the substrate attachment hole, wherein
    the substrate can be held in the substrate attachment hole by inserting the substrate held by the substrate holding portion of the substrate support apparatus into the substrate attachment hole and pushing the substrate against the fixed claw by the transport robot, and pushing the movable claw against the substrate after the substrate is pushed against the fixed claw.

10. The apparatus according to claim 1, wherein the shock absorbing member further allows for rotation of the first connecting plate.

11. The apparatus according to claim 1, wherein the first connecting plate comprises a planar surface, and movement in the vertical and horizontal directions is along the planar surface.

12. The apparatus according to claim 11, wherein the shock absorbing member further allows for rotation of the first connecting plate along an axis transverse to the planar surface.

* * * * *